United States Patent [19]

Okubo

[11] Patent Number: 5,015,975
[45] Date of Patent: May 14, 1991

[54] NOISE FILTER

[75] Inventor: Akira Okubo, Nagaokakyo, Japan

[73] Assignee: Murata Manufacturing Co., Ltd., Nagaokakyo, Japan

[21] Appl. No.: 396,213

[22] Filed: Aug. 21, 1989

[30] Foreign Application Priority Data

Aug. 19, 1988 [JP] Japan ................................ 63-206942

[51] Int. Cl.$^5$ ............................................. H03H 7/00
[52] U.S. Cl. ..................................... 333/181; 333/185
[58] Field of Search ................. 333/167, 170, 172, 181, 333/184, 185, 12

[56] References Cited

U.S. PATENT DOCUMENTS

| | | | |
|---|---|---|---|
| 2,000,441 | 5/1935 | Given | 333/184 |
| 3,457,527 | 7/1969 | Matsushima et al. | 333/184 |
| 3,564,359 | 2/1971 | Coda et al. | 333/184 X |
| 4,215,325 | 7/1980 | Sansone | 333/167 X |
| 4,752,752 | 6/1988 | Okubo | 333/185 X |
| 4,760,355 | 7/1988 | Dash et al. | 333/172 X |
| 4,779,068 | 10/1988 | Sakamoto et al. | 333/177 X |
| 4,794,353 | 12/1988 | Broyde | 333/12 X |

FOREIGN PATENT DOCUMENTS

| | | | |
|---|---|---|---|
| 0039910 | 3/1985 | Japan | 333/184 |
| 0074809 | 4/1985 | Japan | 333/172 |
| 0214013 | 9/1988 | Japan | 333/167 |

Primary Examiner—Eugene R. Laroche
Assistant Examiner—Seung Ham
Attorney, Agent, or Firm—Wenderoth, Lind & Ponack

[57] ABSTRACT

A noise filter used for a digital signal circuit to control the occurrence of distortion in a digital signal waveform, including: an inductance element inserted in series in an input/output line; a capacitor element inserted between the input/output line and a ground terminal, and resistance connected in parallel to the inductance element described above. The resistance functions to control unnecessary oscillation occurring to the inductance element caused by a very small change in pulse signal, thereby eliminating noise effectively without distortion of the digital signal waveform with almost no increase in peak value with respect to the original digital signal.

2 Claims, 3 Drawing Sheets

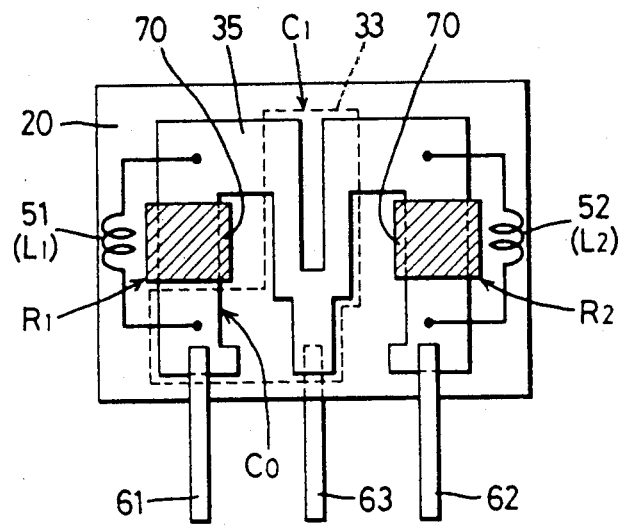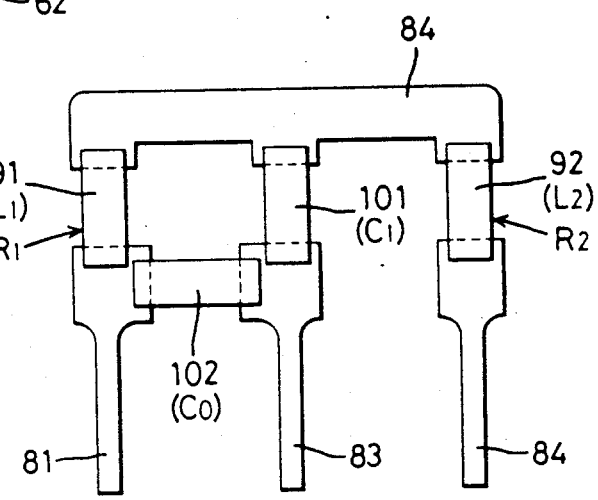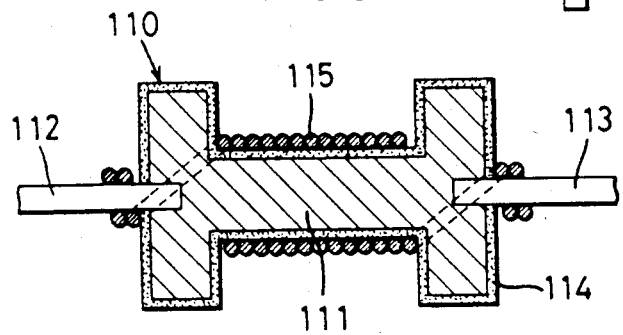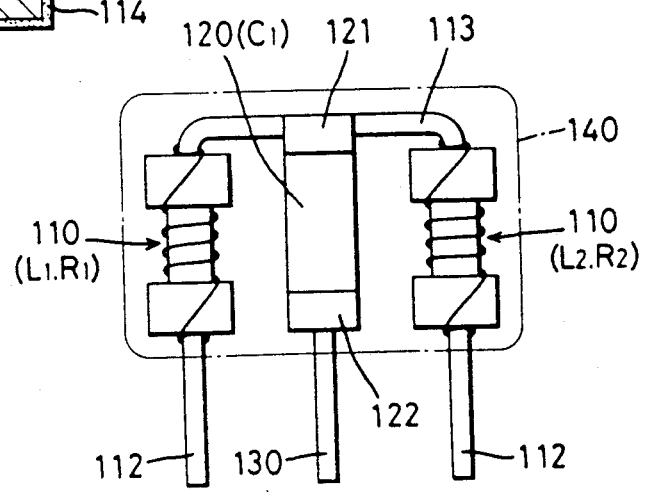

5,015,975

NOISE FILTER

BACKGROUND OF THE INVENTION

The present invention relates to a noise filter, in particular, to a noise filter which controls the occurrence of distortion of a digital signal waveform and functions effectively in a digital signal circuit.

Conventional noise filters for use with digital signals were constructed with inductance elements and capacitor elements being combined in such a form as T-type or π-type and the like.

As one example, the T-type is exemplified in FIG. 12, in which the inductance elements $L_1$ and $L_2$ mentioned above are inserted in series with the input/output line 14 between the input terminal 11 and the output terminal 12, and also a capacitor element $C_1$ is inserted in parallel between the point 15 connecting both inductance elements $L_1$ and $L_2$ and a ground terminal 13.

But, the conventional noise filter constructed as such, when used in high-speed digital signal circuit, causes distortion of the digital signal waveform concurrent with the elimination of noise, that is, causing the occurrence of overshoot, undershoot and ringing, and an increase in the peak value thereof as compared with the original waveform, thus resulting in malfunctions and the like of a circuit. It is assumed that this arises from such various reasons as the inevitable mismatch in impedance between said noise filter and signal system before or after thereof, thus causing a reflected wave to be produced.

For example, the conventional noise filter described above was connected between TTL circuits 2 and 3 as noise filter 4 as shown in FIG. 13, and the waveform was observed. Even though the original digital signal S from the TTL circuit 2 showed a clear waveform as in FIG. 14, the waveforms of the input signal $S_1$ and output signal $S_0$ of the noise filter 4 were significantly distorted. This can be seen in FIGS. 15 and 16. ΔV in FIG. 16 shows increment in peak value with respect to the original digital signal S.

Usually when distortion of a waveform due to ringing and the like is to be controlled, if the equivalent circuit in FIG. 12 is taken by way of example, a resistance is connected in series between the inductance elements $L_1$ and $l_2$ and between the input terminal and output terminal.

But, if resistance is connected in series to the inductances $L_1$ and $L_2$, the waveform of the signal becomes smaller to that extent with the result of malfunctioning of a circuit.

SUMMARY OF THE INVENTION

Accordingly, it is an object of the present invention to provide a noise filter capable of controlling distortion of a waveform and functioning effectively in a digital signal circuit.

It is another object of the present invention to provide a noise filter that can be miniaturized in size, low in manufacturing cost and simple in assembling.

BRIEF DESCRIPTION OF THE DRAWINGS

FIGS. 6 through 8 are plan views exemplifying constructions of noise filters according to the present invention;

FIG. 9 is a sectional view showing one example of an inductor with resistance;

FIGS. 10 and 11 are plan views showing examples of constructions of noise filters according to another example of the present invention;

DESCRIPTION OF THE PREFERRED EMBODIMENTS

Figure 1:
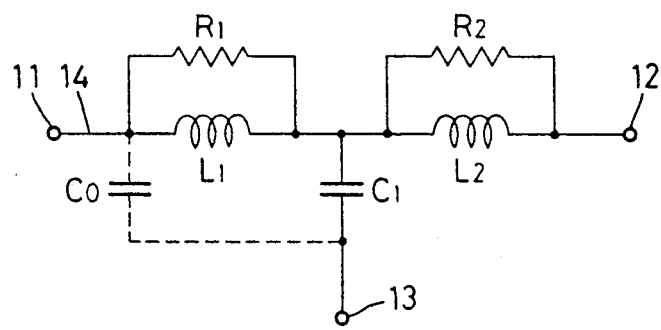
FIG. 1 is an equivalent circuit diagram showing on example of the noise filter according to the present invention.
Figure 12:
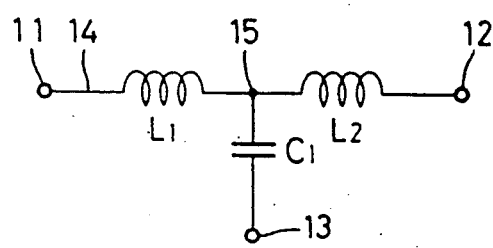
FIG. 12 is an equivalent circuit diagram showing one example of the conventional noise filter.

Explanation is now given mainly on the difference between the noise filter according to the present invention shown in the equivalent circuit of FIG. 1 and the one of the conventional example of FIG. 12. In the present example, resistance elements $R_1$ and $R_2$ are connected in parallel to the inductance elements $L_1$ and $L_2$ respectively, as described above.

Figure 2:
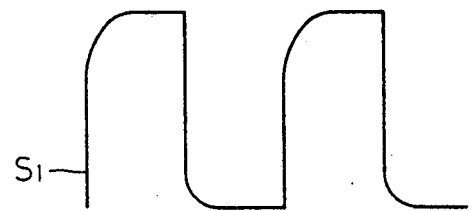
FIGS. 2 and 3 show examples of the waveforms of input signal and output signal respectively when the noise filter of FIG. 1 is used.
Figure 3:
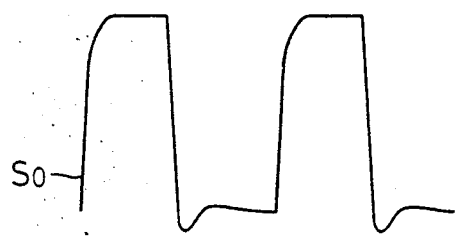
Figure 13:
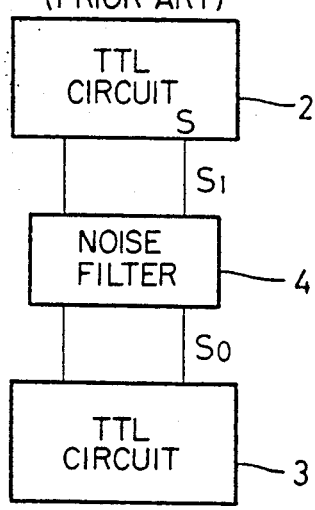
FIG. 13 is a circuit diagram used in observing waveforms.
Figure 14:
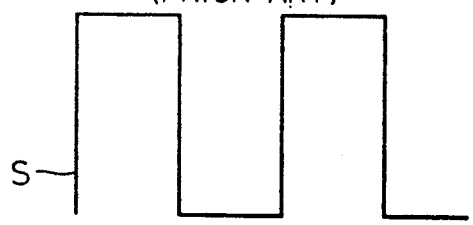
FIG. 14 shows one example of an original digital signal waveform.
Figure 15:
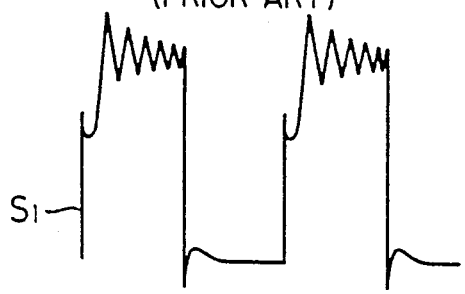
FIGS. 15 and 16 show examples of waveforms of input signal and output signal respectively when the conventional noise filers are used.
Figure 16:
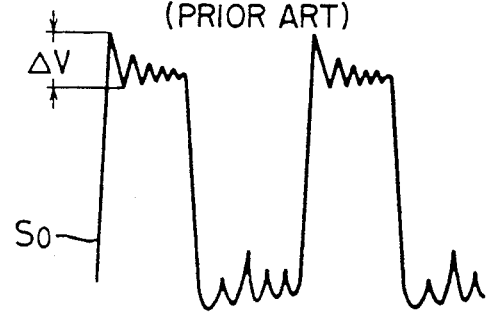

Now, this noise filter was used as noise filter 4 in FIG. 13, and the waveform was observed under the same conditions as those in the conventional example. As the result, nearly clear waveforms shown in FIGS. 2 and 3 were obtained for the input signal $S_1$ and output signal $S_o$ of the noise filter 4, the waveform distortion having been controlled. In the case of the output signal $S_o$, for example, ringing, overshoot and the like are controlled, good rising properties are obtained, and there is almost no increase in peak value with respect to the original digital signal S (see FIG. 14). Accordingly, with the use of this noise filter, noise can be removed in an effective way without distorting the waveform of a digital signal.

It is assumed that the resistance elements $R_1$ and $R_2$ above described function to curb (control) unnecessary oscillation (counterelectromotive force) occurring to the inductance elements $L_1$ and $L_2$ followed by a very small change in the pulse signal.

As shown by a broken line in FIG. 1, a capacitor element $C_o$ having appropriate value may be inserted between the input terminal 11 and the ground terminal 13. By so doing, noise-removing effect of the present noise filter may be further improved.

Figure 4:
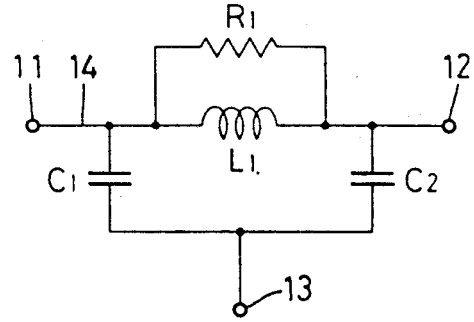
FIGS. 4 and 5 are equivalent circuits showing another example of the noise filter according to the present invention.
Figure 5:
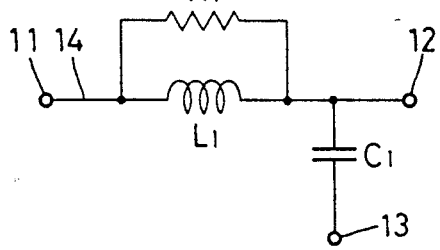

A noise filter capable of improving noise-removing effect when resistance elements connected in parallel to inductance elements is not limited to the T-type as above described, but π-type, L-type or the combination thereof may be used. Examples of the π-type and L-type are shown in FIG. 4 and FIG. 5 respectively.

In each noise filter described above, a resistance may be inserted in series, the resistance having an appropriate value at a suitable position on the input/output line 14 between the input terminal 11 and the output terminal 12 so that noise-removing effect of the noise filter may further be improved. In such a case, it is preferable that said resistance is inserted at both sides, input side and output side, with the connecting point of the (with capacitor element $C_1$ (and $C_2$) as a basic point.

Figure 6:
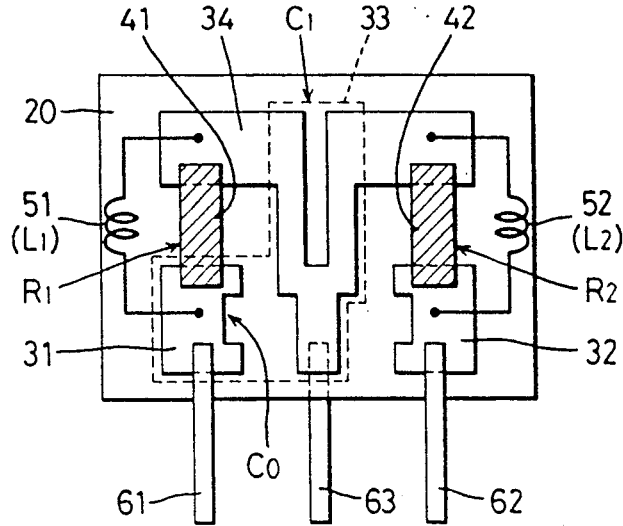

Next, examples of construction of the noise filter (capacitor elements $C_o$ being inserted) having an equivalent circuit as shown in FIG. 1 are shown in the concrete examples of FIGS. 6 through 8, respectively.

In the example of FIG. 6, the line electrode 34 and terminal electrodes 31 and 32 are formed substantially with a T shape on the surface of the dielectric substrate 20, and, on the rear surface, the rear surface electrode 33 is formed opposite to the central portion of the line electrode 34 and the terminal electrode 31 in such a way as to form the above-described capacitor elements $C_1$ and $C_o$. Film resistors 41 and 42 are also provided so that they straddle the terminal electrodes 31 and 32 and the line electrode 34 to form the resistance elements $R_1$ and $R_2$ mentioned above. Furthermore, mounted on the film resistors 41 and 42 are chip coils 51 and 52 to form the inductance elements $L_1$ and $L_2$ described above by connection therewith in parallel. Lead terminals 61–63 used for input, output and ground are connected to the terminal electrodes 31 and 32 and the rear surface electrode 33, respectively.

With the construction as such, a noise filter can be miniaturized with a lower manufacturing cost compared with one using wholly discrete elements.

Instead of forming the film resistors 41 and 42 on the dielectric substrate 20, chip coils 51 and 52 may be used which are formed, for example, on the collar surface or circumferential surface of a ferrite core or the bobbin and in contact with the terminal electrodes. By so doing, the noise filter can be assembled with ease.

If there is no need of the capacitor $C_o$, expansion of the rear surface electrode 33 to the rear surface of the terminal electrode 31 is not required (as in the example shown in FIG. 7).

The different between the examples of FIG. 7 and FIG. 6 lies in that: in the example in FIG. 7, the substantially M-shaped line electrode 35 is formed of metal with a relatively high resistivity (nickel, for example) on the surface of the dielectric substrate 20; a solder resist 70 is applied thereon as is exemplified and then the whole is dipped in solder, and after that the chip coils 51 and 52 are connected thereto. With this method, those parts to which solder resist was applied are not soldered; thus, on those parts, the resistance elements $R_1$ and $R_2$ are respectively formed. The line electrode may be narrowed at the area where the resistance elements $R_1$ and $R_2$ are formed, whereby a large resistance value is obtained.

In the example of FIG. 8, where a dielectric substrate is not used, frame terminals 81–84 are used for input, output, ground and line; the chip coils 91 and 92 are used for inductance elements $L_1$ and $L_2$ and the chip capacitors 101 and 102 are used for capacitor elements $C_1$ and $C_o$ being connected respectively therebetween, as shown. Also, film resistors for the resistance elements $R_1$ and $R_2$ may either be formed between the terminal electrodes of chip coils 91 and 92 or chip resistors therefor may be fixed, one on top of the other, to the rear surface and the like off the chip coils 91 and 92.

FIG. 9 is a sectional view showing one example of an inductor with resistance. In the inductor 110, end portions of the lead terminals 112 and 113 are inserted into the so-called drum-shaped ferrite core 111 at both ends thereof; the film resistor 114, which is also the whole or a part of the surface of the ferrite core 111, is formed in such a manner as to be connected at least to both lead terminals 112 and 113, and coil 115 is wound thereover; the end portions of coil 115 are soldered to the lead terminals 112 and 113. Thus, the equivalent circuit of the inductance 110 is constructed in such a manner that inductance and resistance are alternately connected in parallel.

FIG. 10 shows an example of a noise filter using two inductors 110 with resistance described above. But, in this example, both inductors 110 have each one lead terminal 113 thereof in common. One electrode 121 of the chip capacitor 120 having the electrodes 121 and 122 at both ends, is soldered to the lead terminal 113 while the other electrode 122 is soldered to the other lead terminal 130 to be used for ground; the above-described lead terminal 112 is used for input/output. A cylindrical chip capacitor, a laminated chip capacitor and the like may be used as the chip capacitor 120. The inductor 110 and the chip capacitor 120 may be coated with sheath resin 140, if necessary. This is same as the other examples.

The equivalent circuit of this noise filter is same as the one shown in FIG. 1 except that the former lacks the capacitor element $C_o$. In other words, one conductor 110 forms the inductance element $L_1$ and resistance element $R_1$ connected to each other in parallel, the other inductor 110 forms the inductance element $L_2$ and resistance element $R_2$ also connected to each other in parallel, and the chip capacitor 120 forms the capacitor element $C_1$.

Figure 11:
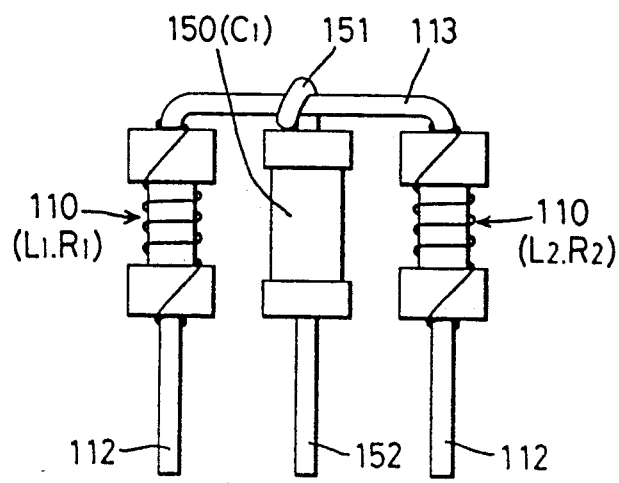

FIG. 11 shows an example of the noise filter in which two inductors 110 with resistance are used, like the one in FIG. 10. The difference between the two examples lies in that, in this example, the capacitor 150 having a lead is used to construct the above-described capacitor element $C_1$, the lead terminals 151 and 152 being pulled out at both ends thereof. One lead terminal 151 is wound around the lead terminal 113 located between the both conductor 110 and then soldered, while the other lead terminal 152 is used for ground.

It is evident in both examples in FIGS. 10 and 11 that use of the inductor 110 with resistance has made it possible to obtain a noise filter having fewer parts, miniaturized and easy to assemble.

In both examples of FIGS. 10 and 11, the lead terminals 112, 113, 130, 151 and 152 are not always limited to a round rod in shape, but may be plate-like such as a frame terminal. Instead of using the lead terminal 113 in common for both inductors 110, two lead terminals 113, each being pulled out of both inductors 110, may be connected by soldering.

I claim:

1. A noise filter comprising a T-type line electrode and input and output terminal electrodes provided on a front surface of a dielectric substrate, an L-shaped rear electrode provided on a rear surface of the dielectric substrate so as to be opposite to a central portion of the T-type line electrode and to the input terminal electrode to respectively form one capacitor element between the central portion of the T-type line electrode and the rear electrode and another capacitor element between the input terminal electrode and the rear electrode, a pair of resistors provided in such a way as to respectively straddle both terminal electrodes and the T-type line electrode and a pair of inductance elements formed by respectively connecting a chip coil in parallel with each of said resistors.

2. A noise filter as set forth in claim 1, wherein the resistors are formed of film resistors.

* * * * *